(12) United States Patent
Stecher

(10) Patent No.: US 7,859,082 B2
(45) Date of Patent: Dec. 28, 2010

(54) LATERAL BIPOLAR TRANSISTOR AND METHOD OF PRODUCTION

(75) Inventor: Matthias Stecher, München (DE)

(73) Assignee: Infineon Technologies AG, Neubiberg (DE)

( * ) Notice: Subject to any disclaimer, the term of this patent is extended or adjusted under 35 U.S.C. 154(b) by 349 days.

(21) Appl. No.: 11/752,734

(22) Filed: May 23, 2007

(65) Prior Publication Data

US 2008/0290463 A1 Nov. 27, 2008

(51) Int. Cl.
*H01L 29/735* (2006.01)

(52) U.S. Cl. .................. 257/557; 257/556; 257/560; 257/575; 257/E29.031; 257/561; 257/563; 257/564; 257/E29.032

(58) Field of Classification Search .................. 257/556, 257/557, 560, 575, E29.031
See application file for complete search history.

(56) References Cited

U.S. PATENT DOCUMENTS

| | | | | |
|---|---|---|---|---|
| 4,075,039 A | * | 2/1978 | Sloan, Jr. ...................... 438/325 |
| 4,704,786 A | * | 11/1987 | Kub ............................. 438/337 |
| 6,469,366 B1 | * | 10/2002 | Nakashima et al. ......... 257/592 |
| 6,566,733 B1 | | 5/2003 | Husher et al. |
| 7,164,190 B2 | * | 1/2007 | Kobashi et al. ............. 257/642 |
| 2002/0030244 A1 | * | 3/2002 | Pruijmboom et al. ....... 257/565 |
| 2005/0056906 A1 | * | 3/2005 | Jimbo et al. ................. 257/492 |

FOREIGN PATENT DOCUMENTS

| | | |
|---|---|---|
| EP | 0657942 A2 | 6/1995 |
| WO | 0035018 | 6/2000 |

* cited by examiner

*Primary Examiner*—Sue Purvis
*Assistant Examiner*—Fei Fei Yeung Lopez
(74) *Attorney, Agent, or Firm*—Dicke, Billig & Czaja, PLLC

(57) ABSTRACT

Emitter and collector regions of the bipolar transistor are formed by doped regions of the same type of conductivity, which are separated by doped semiconductor material of an opposite type of conductivity, the separate doped regions being arranged at a surface of a semiconductor body and being in electric contact with electrically conductive material that is introduced into trenches at the surface of the semiconductor body.

20 Claims, 2 Drawing Sheets forming separate trenches at a surface of a
semiconductor body within doped semiconductor
material of a first type of conductivity

12

introducing a dopant into the semiconductor
body through the trenches, thus forming doped
regions of a second type of conductivity that
is opposite to the first type of conductivity,
and filling the trenches with electrically
conductive material

LATERAL BIPOLAR TRANSISTOR AND METHOD OF PRODUCTION

BACKGROUND

The following description relates to lateral bipolar transistors with regions of emitter, base and collector, which are arranged at a surface of a semiconductor device. The regions of emitter and collector extend vertically into semiconductor material and are doped for a first type of electric conductivity. Between the doped regions of emitter and collector, there is an oppositely doped base region at the surface. The base region forms pn junctions with both the emitter region and the collector region. Electric contacts of the emitter, collector and base can be arranged on the upper surface of the semiconductor device.

In automotive applications, for instance, bipolar transistors are applied to control voltages. For example, pnp transistors may be used. Bipolar transistors can also be applied as switches. In an H bridge, for example, there are four bipolar transistors arranged in two pairs, each pair having two bipolar transistors that are connected in series between the operating voltage of typically 12 V and ground. The connections between both transistors of each pair are connected to the driving connections of an electric motor, thus forming an electric circuit in the shape of an H, the motor being located in the position of the horizontal bar of the H. Such an H bridge enables the operation of the motor in any direction of rotation by simultaneously switching the diagonally arranged transistors on and off. This is also an application in which lateral pnp bipolar transistors are favorable.

Lateral bipolar transistors are characterized by a decrease of the amplification that is effected by the transistor structure with increasing distance from the device surface. This is due to the doping profile of the emitter and collector regions, which are implanted from the upper surface of the device into the semiconductor material. The doping profile results in a larger distance between emitter and collector in deeper regions of the semiconductor body. There is also an increasing electric resistance due to the larger distance from the surface contact.

SUMMARY

It is an embodiment of this invention to improve lateral bipolar transistors. This is achieved by an improved structure of electrically conductive material and doped regions.

These and other features of the invention will become apparent from the following brief description of the drawings, detailed description and appended claims and drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

For a more complete understanding of the present invention, and the advantages thereof, reference is now made to the following descriptions taken in conjunction with the accompanying drawings, in which:

FIG. 3 illustrates a flow chart for a production method.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
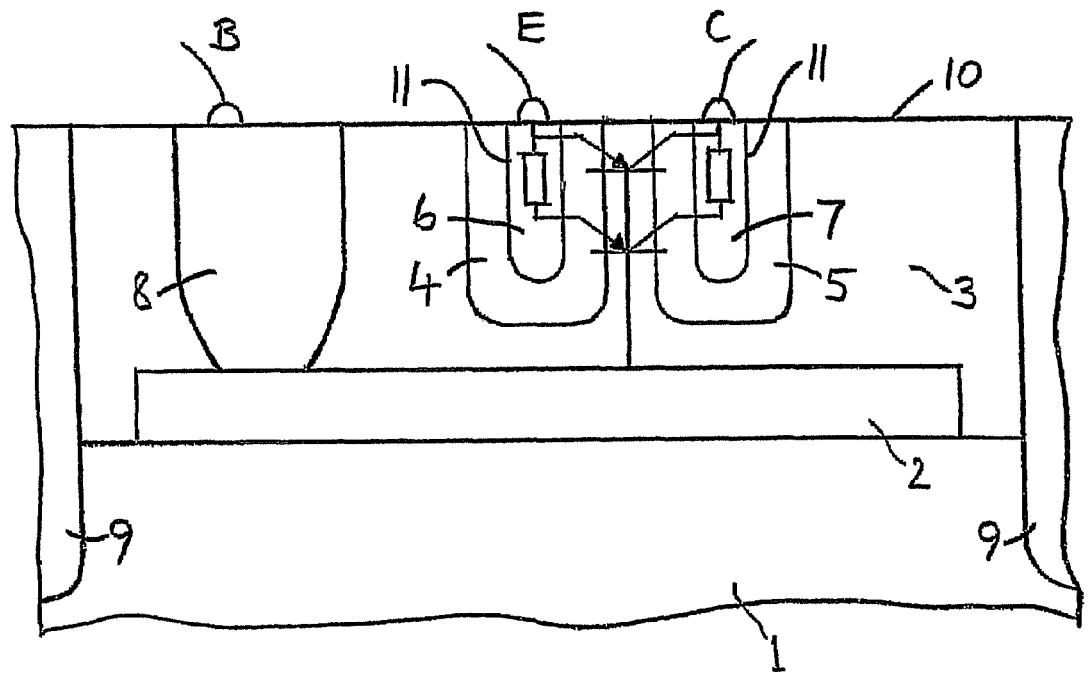
FIG. 1 illustrates a cross-section of an embodiment of the lateral bipolar transistor.

FIG. 1 illustrates a cross-section of an embodiment of the lateral bipolar transistor. The transistor structure is located at a surface 10 of a semiconductor body 1. A buried layer 2 of a first type of conductivity can be arranged in a doped well 3, which is also of the first type of conductivity, but with a lower doping as compared with the buried layer 2. Separate doped regions 4, 5 of a second type of conductivity, are arranged in the well 3. Electrically conductive material 6, 7 is arranged within trenches 11 in contact with the doped regions 4, 5, so that one doped region 4 and corresponding electrically conductive material 6 form an emitter and the other doped region 5 and corresponding electrically conductive material 6 form an emitter and the other doped region 5 and corresponding electrically conductive material 7 form a collector of the lateral bipolar transistor. Between the doped regions 4, 5, there is doped material of the well 3 of opposite type of conductivity. Thus there are pn junctions between the doped regions and the well.

The pn junctions form a transistor structure, which is represented in FIG. 1 by the circuit component symbols of bipolar transistors, which are supposed to be pnp transistors in the example of FIG. 1. The symbols indicate that there is a transistor structure at all locations along the pn junction in vertical direction. The bipolar transistors that are located in deeper regions of the well 3 have a higher resistance of their electric connection than the bipolar transistors that are located closely beneath the surface 10. This is indicated in FIG. 1 by the inserted resistance symbols. Because of the electrically conductive material 6, 7, the electric resistance of the electric connection to the lower bipolar transistors is low. The arrangement and shape of the electrically conductive material 6, 7 and doped regions 4, 5 render comparable values of the amplification of the transistors closely under the surface 10 and in deeper regions around the trench bottoms.

The buried layer 2 can be omitted, but if it is provided, there may also be a sinker contact region 8 provided as an electric connection between the buried layer 2 and an upper base contact on the surface 10. The exterior electric contacts for base B, emitter E and collector C are schematically indicated on the surface 10 in FIG. 1. The bipolar transistor may laterally be insulated by isolations 9, which can be formed of a dielectric material like an oxide of the semiconductor material, for example. The well may be doped for n-type conductivity, for example; in this case, the doped regions 4 and 5 of emitter and collector are doped for p-type conductivity. This is an example of a pnp bipolar transistor. But the signs of conductivity can be reversed, so that the doped well 3 is p-type and the doped regions 4, 5 are n-type semiconductor material.

Figure 2:
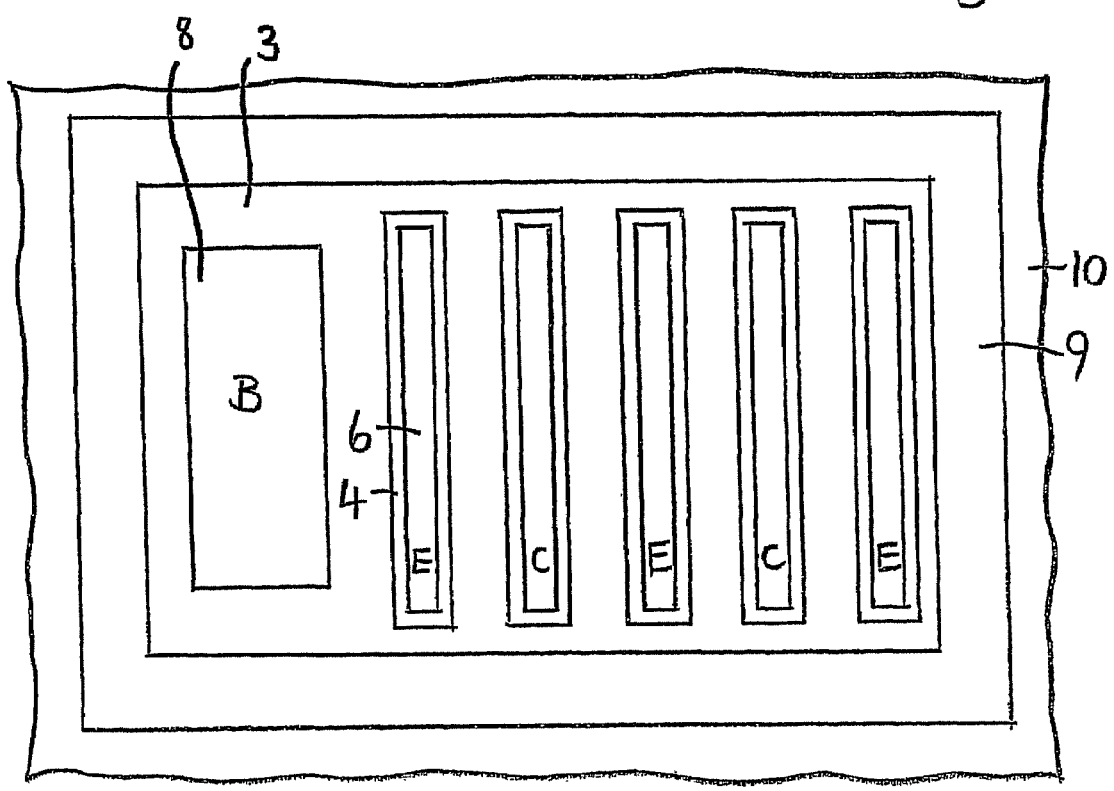
FIG. 2 illustrates a plan view of an embodiment of the lateral bipolar transistor.

FIG. 2 illustrates a plan view of an embodiment that has pluralities of emitter regions and collector regions. In the example illustrated in FIG. 2, the trenches by which emitter and collector regions are formed have an elongated shape defining a longitudinal direction and are surrounded by the material of the doped regions 4, 5. There is an alternating succession of emitters E and collectors C. The shape of the trenches can be varied in accordance with the requirements of special embodiments. The arrangement illustrated in FIG. 2 is only one example, which illustrates that there may be a plurality of emitter regions and a plurality of collector regions. Each doped region 4, 5 has a homogeneous thickness around an entirety of the electrically conductive material 6, 7, respectively. The arrangement of the electrically conductive material 6, 7 reaching down into the semiconductor body and being in contact with the doped regions 4, 5 to form emitters and collectors provides a connection of low resistance of the whole junction area between the regions of oppositely doped semiconductor material. The electrically conductive material 6, 7 can be any suitable electrically conductive material like metal, graphite or highly doped semiconductor material, especially conductively doped polysilicon, for example. The doped regions 4, 5 can be formed by an implantation or a diffusion of a dopant through trenches 11 that are formed in the surface 10 of the semiconductor body 1.

The sinker contact region 8 is arranged laterally on one side, but sinker contact regions may also be disposed on both sides of the emitter and collector arrangement, especially in a symmetrical fashion. FIG. 2 illustrates how the doped well 3 is laterally framed by the isolation 9. But the isolation 9 can be omitted and the doped well 3 can be substituted with a basic doping of the substrate 1. In embodiments in which no well is provided, the base contact can be arranged on a rear surface of the semiconductor body, i.e., on a surface that is opposite to the surface 10 illustrated in FIGS. 1 and 2. The arrangement of a buried layer 2 and a sinker contact region 8 of comparatively high concentration of doping atoms enables an arrangement of the base contact on the upper surface 10.

A method of production of a lateral bipolar transistor provides a semiconductor body lie a substrate or a wafer with a basic doping of a first type of conductivity or with a doped well of a first type of conductivity at a surface of the semiconductor body. Separate trenches 11 are formed at the surface (12, FIG. 3) and are arranged within the doped well, if a doped well is provided. A dopant is introduced into the semiconductor body through the trenches to form the doped regions of emitter and collector. The dopant is selected in such a manner that pn junctions are formed between the doped regions and the surrounding material of the semiconductor body or doped well. The trenches are filled with electrically conductive material (13, FIG. 3).

The dopant can be introduced into the semiconductor body by introducing a doped material into the trenches and diffusing the dopant out of the doped material into the surrounding semiconductor body. This is especially suitable if the semiconductor body is also silicon. Instead of polysilicon, a silicate glass can be used. Boron atoms may serve as a dopant for p-type conductivity and phosphorus atoms as a dopant for n-type conductivity, for example. Accordingly, pnp bipolar transistors can be formed using boron silicate glass or polysilicon that is doped with boron silicate glass or polysilicon that is doped with boron, for example, and npn bipolar transistors can be formed using phosphorus silicate glass or polysilicon that is doped with phosphorus, for example. The pn junctions forming the transistor structure are present between the doped regions 4, 5 and the doped semiconductor material in between, which has the basic doping of the semiconductor body 1 or is part of the doped well 3 within the semiconductor body 1. If the concentration of the dopant in the material that is filled in to the trenches is sufficiently high to produce a low electric resistance, the material can remain in the trenches and form the electrically conductive material. Instead, it is possible to remove this material and to substitute it with an electrically conductive material like metal, graphite or a sufficiently highly doped semiconductor material, the sign of the electric conductivity of the contiguous doped regions 4, 5. Thus, a low resistance between the electrically conductive material within the trenches 11 and the related doped regions 4, 5 is provided. The doped regions 4, 5 can surround the electrically conductive material as illustrated in FIGS. 1 and 2, but it is sufficient if the electrically conductive material is present only at a side of the doped regions 4, 5 and extends down into the semiconductor body to the deeper portions or lower ends of the doped regions 4, 5.

Additionally, a buried layer 2 of the first type of conductivity can be formed under the trenches. The buried layer 2 is doped higher than the basic doping or the doped well and is provided to reduce the resistance between a base contact and the doped semiconductor material between the doped regions 4, 5 of emitter and collector.

The described arrangement of electrically conductive material within the trenches 11 makes it possible to reduce the distance between emitter and collector, because the breakthrough voltage is no longer determined by the device structure closely at the surface 10. The operation of the lateral bipolar transistor is thus similar at the surface 10 and in lower regions near the bottom of the trenches 11. The production of emitter and collector by forming the doped regions 4, 5 through the trenches 11 thus generates a more homogeneous transistor structure throughout different levels under the surface 10. Therefore, this arrangement provides several improvements and advantages in comparison with prior art bipolar transistors. The lateral bipolar transistor as described can easily be integrated into integrated circuits.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A lateral bipolar transistor, comprising:
   a semiconductor body having a surface;
   a doped well of a first type of conductivity at the surface;
   separate trenches at the surface within the doped well;
   electrically conductive material filling the trenches;
   separate contacts on the electrically conductive material;
   separate doped regions of a second type of conductivity that is opposite to the first type of conductivity;

wherein the electrically conductive material in each trench is in contact with one of the doped regions and each doped region has a homogeneous thickness around an entirety of the electrically conductive material, respectively; and wherein the doped regions and the doped well form a bipolar transistor, and wherein one of the doped regions provides a collector of the bipolar transistor and another one of the doped regions provides an emitter of the bipolar transistor.

2. The lateral bipolar transistor of claim 1, wherein the trenches are each surrounded by one of the doped regions, respectively.

3. The lateral bipolar transistor of claim 1, further comprising:
a further doped region of a first type of conductivity arranged in the doped well at a distance from the doped regions of the second type of conductivity.

4. A lateral bipolar transistor comprising:
a semiconductor body having a surface;
a doped well of a first type of conductivity at the surface;
separate trenches at the surface within the doped well;
electrically conductive material filling the trenches;
separate doped regions of a second type of conductivity that is opposite to the first type of conductivity;
wherein the electrically conductive material in each trench is in contact with one of the doped regions, respectively;
a further doped region of the first type of conductivity arranged in the doped well at a distance from the doped regions of the second type of conductivity, the further doped region separated from an entirety of the doped regions of the second type of conductivity by material of the doped well;
wherein the doped regions and the doped well form a bipolar transistor;
wherein the further doped region encompasses a buried layer that is arranged under the trenches with respect to the surface and a sinker contact region that is arranged between the buried layer and the surface; and
contacts on the electrically conductive material and the sinker contact region.

5. The lateral bipolar transistor of claim 4, wherein the contacts provide electric connections to emitter, base and collector for the bipolar transistor.

6. The lateral bipolar transistors of claim 4, wherein the further doped region has a higher doping than the doped well.

7. A lateral bipolar transistor comprising:
a semiconductor body having a surface;
trenches at the surface, the trenches being filled with electrically conductive material;
doped regions of a first type of conductivity that are separated by a doped region of a second type of conductivity that is opposite to the first type of conductivity;
wherein the doped regions of the first type of conductivity each are in electric contact with the electrically conductive material of one of the trenches and each doped region has a homogeneous thickness around an entirety of the electrically conductive material, respectively; and
wherein one of the doped regions of the first type of conductivity provides a collector of the bipolar transistor and another one of the doped regions of the first type of conductivity provides an emitter of the bipolar transistor.

8. The lateral bipolar transistor of claim 7, wherein the electrically conductive material is doped semiconductor material.

9. The lateral bipolar transistor of claim 7, wherein the electrically conductive material is doped polysilicon.

10. The lateral bipolar transistor of claim 7, wherein the electrically conductive material is metal.

11. The lateral bipolar transistor of claim 7, wherein the electrically conductive material is graphite.

12. A lateral bipolar transistor comprising:
a semiconductor body having a surface;
a doped well of a first conductivity type at the surface;
a first trench at the surface within the doped well, the first trench filled with first electrically conductive material;
a first doped region of a second conductivity type opposite to the first conductivity type, the first doped region in contact with the first electrically conductive material and having a homogeneous thickness around an entirety of the first electrically conductive material;
a second trench at the surface within the doped well, the second trench filled with second electrically conductive material;
a second doped region of the second conductivity type, the second doped region in contact with the second electrically conductive material and having a homogeneous thickness around an entirety of the second electrically conductive material, the second doped region adjacent to the first doped region,
wherein the first electrically conductive material and the first doped region provide an emitter of a bipolar transistor, and
wherein the second electrically conductive material and the second doped region provide a collector of the bipolar transistor.

13. The lateral bipolar transistor of claim 12, further comprising:
a buried layer that is arranged under the first trench and the second trench with respect to the surface, the buried layer of the first conductivity type,
wherein the buried layer provides a base of the bipolar transistor.

14. The lateral bipolar transistor of claim 13, further comprising:
a sinker contact region that is arranged between the buried layer and the surface.

15. The lateral bipolar transistor of claim 13, wherein the buried layer is separated from an entirety of the first doped region and from an entirety of the second doped region by material of the doped well.

16. The lateral bipolar transistor of claim 13, wherein the buried layer has a higher doping than the doped well.

17. The lateral bipolar transistor of claim 12, wherein the first electrically conductive material is doped semiconductor material, and
wherein the second electrically conductive material is doped semiconductor material.

18. The lateral bipolar transistor of claim 12, wherein the first electrically conductive material is doped polysilicon, and
wherein the second electrically conductive material is doped polysilicon.

19. The lateral bipolar transistor of claim 12, wherein the first electrically conductive material is metal, and
wherein the second electrically conductive material is metal.

20. The lateral bipolar transistor of claim 12, wherein the first electrically conductive material is graphite, and
wherein the second electrically conductive material is graphite.

* * * * *